United States Patent [19]

Miura

[11] Patent Number: 4,595,887
[45] Date of Patent: Jun. 17, 1986

[54] VOLTAGE CONTROLLED OSCILLATOR SUITED FOR BEING FORMED IN AN INTEGRATED CIRCUIT

[75] Inventor: Masami Miura, Tokyo, Japan

[73] Assignee: NEC Corporation, Tokyo, Japan

[21] Appl. No.: 737,268

[22] Filed: May 23, 1985

[30] Foreign Application Priority Data

May 24, 1984 [JP] Japan .................. 59-105186

[51] Int. Cl.⁴ .............. H03L 7/00; H03B 5/00; H03B 5/12
[52] U.S. Cl. .................. 331/8; 331/20; 331/34; 331/177 R; 358/19; 358/25
[58] Field of Search .............. 331/8, 20, 34, 116 R, 331/177 R; 358/17, 19, 25, 28

[56] References Cited

U.S. PATENT DOCUMENTS

| | | | |
|---|---|---|---|
| 3,691,475 | 9/1972 | Mouri et al. | 331/20 X |
| 4,128,817 | 12/1980 | Gomi | 331/34 X |
| 4,234,858 | 11/1980 | Gomi | 331/177 R |
| 4,485,353 | 11/1984 | Fang et al. | 331/8 |
| 4,485,354 | 11/1984 | Shanley, II et al. | 331/8 |

Primary Examiner—Eugene R. LaRoche
Assistant Examiner—D. C. Mis
Attorney, Agent, or Firm—Burns, Doane, Swecker & Mathis

[57] ABSTRACT

A voltage controlled oscillator comprises a tank circuit for determining an oscillation frequency, a first circuit for delaying the signal having the oscillation frequency, a second circuit for advancing the signal having the oscillation frequency, the first and second circuit being connected in series, a third circuit interposed between the tank circuit and the series connection of the first and second circuits, the third circuit having the same equivalent circuit of the series connection, a first gain controlled amplifier amplifying the output from the first circuit, a second gain controlled amplifier amplifying the output from the second circuit, an adder for adding outputs from the first and second gain controlled amplifiers, a control circuit controlling the gains of the first and second gain controlled amplifiers, and a feed-back circuit for feeding the output of the adder to the tank circuit.

10 Claims, 6 Drawing Figures

VOLTAGE CONTROLLED OSCILLATOR SUITED FOR BEING FORMED IN AN INTEGRATED CIRCUIT

BACKGROUND OF THE INVENTION

1. Field of the Invention:

This invention relates to a voltage controlled oscillator, and more particularly to that having an oscillation frequency free from variation in resistance used therein.

2. Description of the Prior Art:

The voltage controlled oscillator is widely used in PLL (Phase Locked Loop) circuits and so on formed in a semiconductor integrated circuit. The PLL circuit has a wide application such as an FM stereo multiplexer. In the FM stereo multiplexer, a frequency signal of about 76 KHz is generated from a voltage controlled oscillator and is divided to provide a frequency signal of about 19 KHz, the phase of which is compared with a pilot signal of 19 KHz in an FM composite signal. The result of the comparison is derived as a form of voltage which is fed to the voltage controlled oscillator to control the oscillator to exactly oscillate with 76 KHz.

The voltage controlled oscillator in the prior art is composed of a C-R time constant circuit charged by a controlled current, a differential amplifier having a first input point receiving the voltage from the C-R time constant circuit, a second input point and a load of current mirror circuit, a first transistor receiving the output signal from the current mirror circuit at its base and feeding its collector output to the first input point of the differential amplifier, and a second transistor receiving the output signal from the current mirror circuit at its base and feeding its collector output to the second input point of the differential amplifier through a voltage divider of resistors. In a semiconductor integrated circuit, all the circuit elements except for the C-R time constant circuit are formed on a semiconductor chip. Especially, the resistances of the resistors in the voltage divider are sensitive to the change in manufacturing condition of the integrated circuit. The variation of the resistances affect the oscillation frequency of the voltage controlled oscillator in the prior art. Thus, the voltage controlled oscillator in the prior art has a drawback that a stable oscillation frequency irrespective of the manufacturing condition cannot be obtained if it is formed in a semiconductor integrated circuit.

SUMMARY OF THE INVENTION

The primary object of the invention is to provide a voltage controlled oscillator suited for being formed in a semiconductor integrated circuit, and more particularly to provide a voltage controlled oscillator having an oscillation frequency which is not affected from the variation of manufacturing condition.

According to the present invention, there is provided a voltage controlled oscillator comprising a tank circuit for determing an oscillation frequency, a first circuit for delaying the phase of the signal having the oscillation frequency, a second circuit for advancing the phase of the signal having the oscillation frequency, the first and second circuits being connected in series, a third circuit interposed between the tank circuit and the series connection of the first and second circuits, the third circuit having the same equivalent circuit as the series connection, a first gain controlled amplifier for amplifying the output from the first circuit, a second gain controlled amplifier for amplifying the output from the second circuit, a means for controlling the gains of the first and second gain controlled amplifiers, an adder for adding the output signals from the first and second gain controlled amplifiers, a means for deriving an output signal from the adder and a means for feeding the output signal of the adder to the tank circuit to form a positive feed-back loop.

The voltage controlled oscillator according to the present invention controls the oscillation frequency of the tank circuit by controlling the gains of the gain controlled amplifiers. More specifically, by controlling the gains of the gain controlled amplifiers, the phase of the output signal from the adder is changed. The phase controlled output signal is applied to the tank circuit. The oscillation frequency of the tank circuit changes by the phase of the output signal applied thereto.

The first circuit is preferably a resistor. The second circuit is preferably a capacitor. The third circuit is preferably a series connection of a resistor having the same resistance of the resistor in the first circuit and a capacitor having the same capacitance of the capacitor in the second circuit. Therefore, all the circuit elements except for the tank circuit are easily formed in a semiconductor integrated circuit. In such case, if the resistances of the resistors and the capacitances of the capacitors are deviated by unstable manufacturing condition, the time delay across the resistor and the time advance across the capacitor are same in absolute value, because the resistor and capacitor are connected in series. Due to this fact, the change in phase of the output signal from the adder only depends on the gains of the gain controlled amplifiers. This results in that the oscillation frequency is not changed by the deviation of the manufacturing condition of the semiconductor integrated circuit.

BRIEF DESCRIPTION OF THE DRAWINGS

The above and further objects, features and advantages of the present invention will become more apparent from the following detailed description of embodiments taken in conjunction with the accompanying drawings, wherein.

Figure 1:
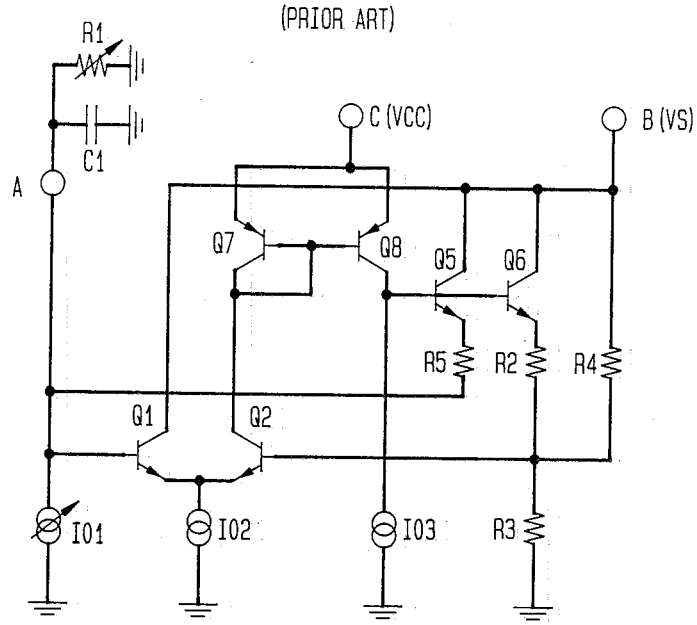
FIG. 1 is a circuit diagram showing a voltage controlled oscillator in the prior art.

The voltage controlled oscillator in the prior art shown in FIG. 1 has a parallel circuit of a variable resistor $R_1$ and a capacitor $C_1$. The capacitor $C_1$ is charged by a constant current source $I_{01}$, the constant current of which is variable. The variable resistor $R_1$ and the capacitor $C_1$ are circuits elements externally connected to a semiconductor integrated circuit at a terminal A. The terminal A is connected to a base of a transistor $Q_1$ in the integrated circuit. The transistor $Q_1$ forms a differential amplifier together with a transistor $Q_2$ and a constant current source $I_{02}$. The collector of the transistor $Q_1$ is supplied with a stabilized power voltage $V_s$ from a terminal B. The collector of the transistor $Q_2$ is connected with a collector and base of a transistor $Q_7$ which forms a current mirror with a transistor $Q_8$. An unstabilized voltage $V_{cc}$ is supplied to the emitters of the transistors $Q_7$ and $Q_8$ from a terminal C. The collector of the transistor $Q_8$ is connected with bases of transistors $Q_5$ and $Q_6$ having collectors connected to the terminal B and is supplied with a current from a constant current source $I_{03}$. The emitter of the transistor $Q_5$ is connected with the base of the transistor $Q_1$ to form a positive feed-back loop. The emitter of the transistor $Q_6$ is grounded through resistors $R_2$ and $R_3$. The connecting point of the resistors $R_2$ and $R_3$ is directly connected with the base of the transistor $Q_2$ on one hand and connected with the terminal B through a resistor $R_4$ on the other hand.

The above-explained voltage controlled oscillator oscillates by repeated switching of the transistors $Q_1$ and $Q_2$ which is established by the charging and discharging of the capacitor $C_1$ and the positive feed-back from the emitter of the transistor $Q_5$ to the base of the transistor $Q_1$. More specifically, at the start of oscillation, the capacitor $C_1$ is not charged to keep the terminal A at ground. The transistor $Q_1$ is an off state and the transistors $Q_2$, $Q_7$, $Q_8$, $Q_5$ and $Q_6$ are an on state. In this condition, the capacitor $C_1$ is charged from the emitter of the transistor $Q_5$ to gradually rising the voltage at the terminal A. When the voltage at the terminal A reaches the voltage ($V_H$) at the connecting point of the resistors $R_2$ and $R_3$, the transistor $Q_1$ turns on to turn off the other transistors $Q_2$, $Q_7$, $Q_8$, $Q_5$ and $Q_6$. The charges in the capacitor $C_1$ discharges through the variable resistor $R_1$ to gradually decrease the voltage at the terminal A. When the voltage at the terminal A falls to the same voltage as the voltage ($V_L$) at the connecting point of the resistors $R_2$ and $R_3$, the transistor $Q_1$ turns on again and the other transistors turn off to continue the above-described operation.

Figure 2:
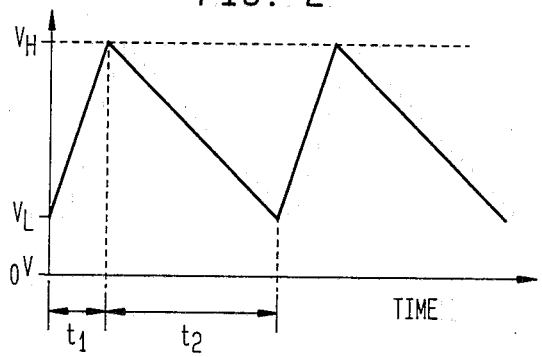
FIG. 2 is a waveform showing an output from the voltage controlled oscillator in the prior art.

Thus obtained wave form at the terminal A is shown in FIG. 2. Now, if the constant current from the constant current source $I_{01}$ is assumed as "0", the high and low levels $V_H$ and $V_L$ and the periods $t_1$ and $t_2$ (where $t_1$ is a period of the rising part and $t_2$ is a period of the falling part) of the output signal at the terminal A are expressed as follows:

$$V_H = (V_S - V_{CEsat\,Q6}) \times \frac{\gamma_3}{\gamma_2 + \gamma_3} \quad (1)$$

$$V_L = V_s \cdot \frac{\gamma_3}{\gamma_4 + \gamma_3} \quad (2)$$

$$t_1 = \gamma_5 \cdot C_1 \cdot \ln\left(\frac{V_S - V_L}{V_S - V_H}\right) \quad (3)$$

$$t_2 = \gamma_5 \cdot C_1 \cdot \ln\left(\frac{V_H}{V_L}\right) \quad (4)$$

where $\gamma_1$ to $\gamma_5$ are resistances of the resistors $R_1$ to $R_5$, $V_{CEsat}\,Q_6$ is a saturation voltage between collector and base of the transistor $Q_6$.

Here, if the saturation voltage $V_{CEsat}\,Q_6$ is neglected, the perios $t_1$ and $t_2$ can be transformed as follows:

$$t_1 = \gamma_5 \cdot C_1 \cdot \ln\left[\frac{\left(1 - \frac{\gamma_3}{\gamma_4 + \gamma_3}\right)}{\left(1 - \frac{\gamma_3}{\gamma_2 + \gamma_3}\right)}\right] \quad (5)$$

$$t_2 = \gamma_1 \cdot C_1 \cdot \ln\left(\frac{\gamma_4 + \gamma_3}{\gamma_2 + \gamma_3}\right) \quad (6)$$

The frequency $f_{OSC}$ is as follows:

$$f_{OSC} = \frac{1}{t_1 + t_2} \quad (7)$$

As apparent from the equations (5) to (7), the oscillation frequency $f_{OSC}$ has parameters of resistances $\gamma_1$ to $\gamma_5$. In other words, the oscillation frequency $f_{OSC}$ is affected from the change of the resistances $\gamma_1$ to $\gamma_5$. Such resistances $\gamma_1\,\gamma_5$ of the resistors $R_1$ to $R_5$ formed in the semiconductor integrated circuit is very sensitive to the variation of manufacturing condition. Therefore, the voltage controlled oscillator in the prior art has a drawback that the oscillation frequency $f_{OSC}$ deviates by the manufacturing condition of the integrated circuit.

DETAILED DESCRIPTION OF THE PREFERRED EMBODIMENT

Figure 3:
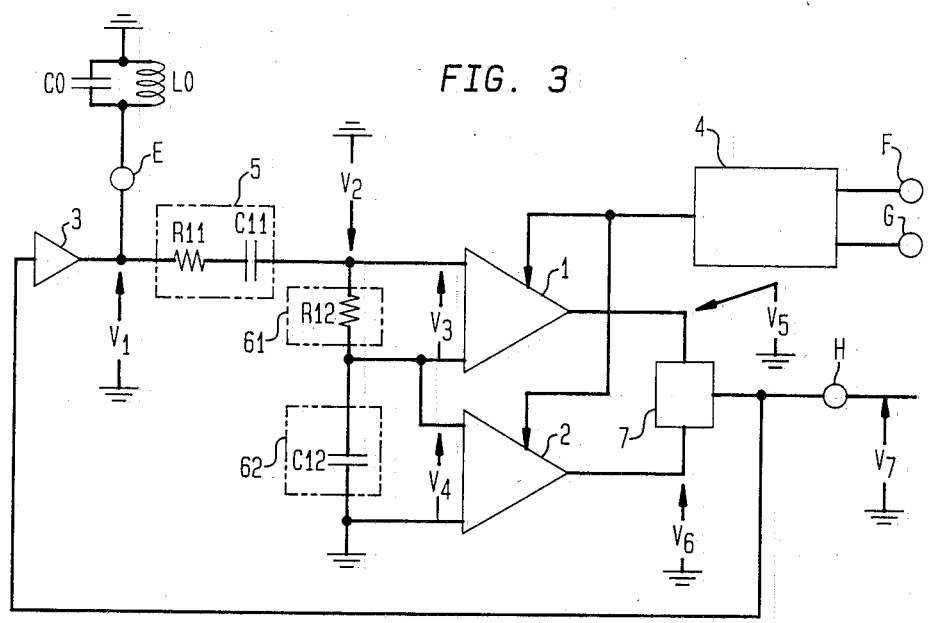
FIG. 3 is a block diagram showing a preferred embodiment of the present invention.

The preferred embodiment of the present invention is shown in the block diagram of FIG. 3. All the circuit elements except for a tank circuit composed of an inductor $L_O$ and a capacitor $C_O$ are formed in a semiconductor integrated circuit. The tank circuit is connected to the integrated circuit at a terminal E. In the integrated circuit, the terminal E is connected to a series circuit 5 of a resistor $R_{11}$ and a capacitor $C_{11}$. The other end of the series circuit 5 is grounded through a resistor $R_{12}$ operating as a phase delaying circuit 61 and a capacitor $C_{12}$ operating as a phase advancing circuit 62. The resistors $R_{11}$ and $R_{12}$ have the same resistances and the capacitors $C_{11}$ and $C_{12}$ have the same capacitances. Therefore, the signal $V_2$ at the other end of the series circuit 5 has just half voltage of the signal at the terminal E and has the same phase as at the terminal E. The series circuit 5 is inserted to prevent the tank circuit from affecting the phase shift values of the phase delaying and advancing circuits 61 and 62. The signal $V_3$ across the resistor $R_{12}$ has a phase delayed from the signal $V_2$ and the signal $V_4$ across the capacitor $C_{12}$ has a phase advanced from the signal $V_2$. The absolute values of the delay of the signal $V_3$ and the advance of the signal $V_4$ are same irrespective of the resistance of the resistor $R_{12}$ and the capacitance of the capacitor $C_{12}$. Here, the values of the resistances of the resistors $R_{11}$, $R_{12}$, the capacitances of the capacitors $C_{11}$, $C_{12}$, the inductance $l_O$ of the inductor $L_O$ and the capacitance $C_O$ of the capacitor $C_O$ are selected so as to satisfy the equation (8) defined as follows:

$$\frac{1}{2\pi\sqrt{l_O \cdot C_O}} = \frac{1}{2\pi\sqrt{\gamma_{11} \cdot C_{11}}} = \frac{1}{2\pi\sqrt{\gamma_{12} \cdot C_{12}}} \quad (8)$$

The signal $V_3$ across the resistor $R_{12}$ is applied to a gain controlled amplifier 1, while the signal $V_4$ across the capacitor $C_{12}$ is applied to another gain controlled amplifier 2. The gains of the gain controlled amplifiers 1 and 2 are controlled by applying control voltages through a gain control circuit 4 in response to input signal applied to terminals F and G. The output signals $V_5$ and $V_6$ from the gain controlled amplifiers 1 and 2 are added by an adder 7. The added output is fed back to the tank circuit of the inductor $L_O$ and the capacitor $C_O$ through an amplifier 3. The oscillation output signal $V_7$ is derived from the output of the adder through an output terminal H.

Figure 4:
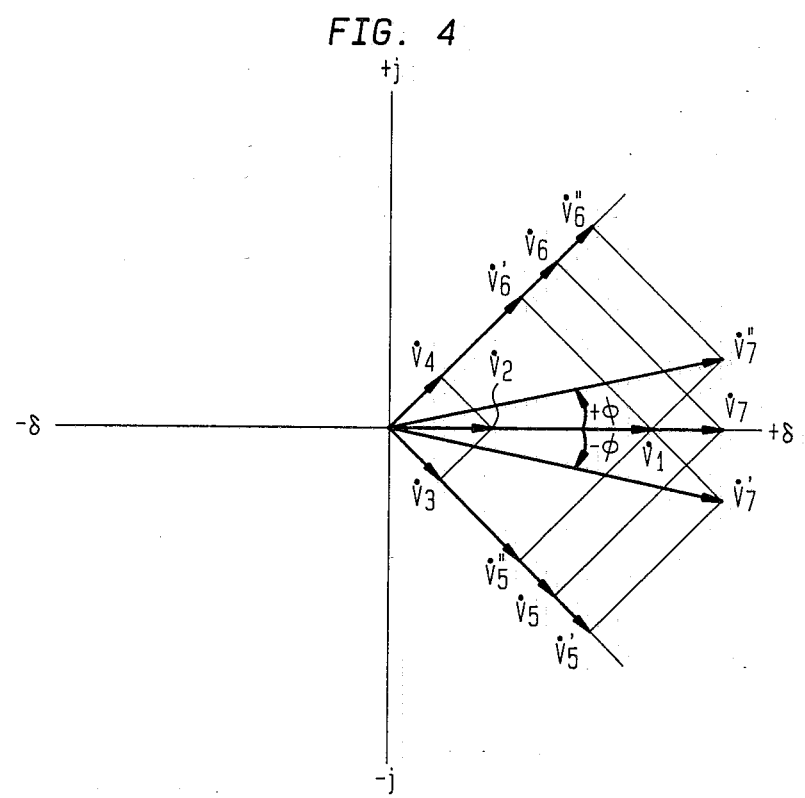
FIG. 4 is a drawing showing the phase relationship between the inputs and output of the adder used in the preferred embodiment.
Figure 5:
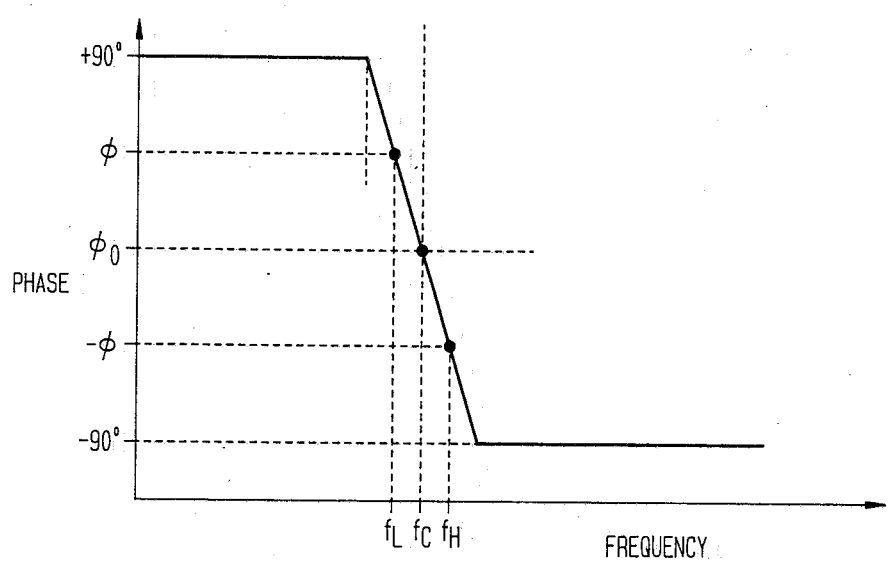
FIG. 5 is a drawing showing a relationship between the phase of the signal applied to the tank circuit and the oscillation frequency of the tank circuit.

The tank circuit of the inductor $L_O$ and the capacitor $C_O$ has a characteristic that the oscillation frequency changes from its center frequency $f_c$ to high and low in accordance with the phase difference of the applied signal from the phase of the oscillation signal at the center frequency $f_c$, as shown in FIG. 5. The phase of the signal to be applied to the tank circuit is controlled by the phase delaying circuit 61, the phase advancing circuit 62, the gain controlled amplifiers 1 and 2 and the adder 7. The phase control will be explained with reference to FIG. 4. Now, the gains of the gain controlled amplifiers 1 and 2 are made equally unity. The phase delayed signal $\dot{V}_3$ and the phase advanced signal $\dot{V}_4$ are added by the adder 7 to produce an outut signal $\dot{V}_2$ having an absolute value of a half of and the same phase as the oscillation signal $\dot{V}_1$ from the tank circuit. The added signal $\dot{V}_2$ is amplified by the amplifier 3 and then applied to the tank circuit to keep an oscillation at the center frequency $f_c$ (see FIG. 5). If the gains of the gain controlled amplifiers 1 and 2 are equal to a gain larger than the unity, the amplified signals $\dot{V}_5$ and $\dot{V}_6$ are similarly added by the adder 7 to generate an output signal $\dot{V}_7$ having the same phase as the oscillation signal $\dot{V}_1$. The output signal $\dot{V}_7$ is fed back to the tank circuit through the amplifier 3 to keep the oscillation of the tank circuit at the center frequency $f_c$. Thus, if the gains of the gain controlled amplifiers 1 and 2 are equal, the whole circuit oscillates at the center frequency $f_c$ which can be expressed as $$f_c = \frac{1}{2\pi \sqrt{l_0 \cdot C_0}} = \frac{1}{2\pi \sqrt{\gamma_{11} \cdot C_{11}}} = \frac{1}{2\pi \sqrt{\gamma_{12} \cdot C_{12}}}.$$

Now, if the gain of the gain controlled amplifier 1 is made larger than that of the gain controlled amplifier 2, the phase delayed signal $\dot{V}'_5$ and the phase advanced signal $\dot{V}'_6$ are added to produce an output signal $\dot{V}'_7$ having a phase $\phi$ delayed with a value according to the difference between the gains of the gain controlled amplifiers 1 and 2. The output signal $\dot{V}'_7$ is fed back to the tank circuit through the amplifier 3 to oscillate the tank circuit at a frequency $f_H$ higher than the center frequency $f_c$ in accordance with the phase difference $(-\phi)$ of the output signal $\dot{V}'_7$ from the undelayed phase $\phi_O$, as shown in FIG. 5. On the contrary, if the gain of the gain controlled amplifier 2 is made larger than the gain controlled amplifier 1, the phase delayed output $\dot{V}'''_5$ and the phase advanced output $\dot{V}'''_6$ are added to produce an output signal $\dot{V}'''_7$ having a phase $+\phi$ advanced with a value according to the difference between the gains of the gain controlled amplifiers 1 and 2. The output signal $\dot{V}'''_7$ is fed back to the tank circuit through the amplifier 3 to keep the oscillation of the tank circuit at a frequency $f_L$ lower than the center frequency $f_c$ in accordance with the phase difference $(+\phi)$ of the output signal $V'''_7$ from the unadvanced phade $\phi_O$, as shown in FIG. 5.

Thus, the oscillation frequency is controlled by the gains of the gain controlled amplifiers 1 and 2. Here, since the phase delayed value by the resistor $R_{12}$ and the phase advanced value by the capacitor $C_{12}$ are equal irrespective of the resistance $\gamma_{12}$ and the capacitance $C_{12}$, the oscillation frequency depends on only the gains of the gain controlled amplifiers 1 and 2. If the resistance $\gamma_{12}$ and the capacitance $C_{12}$ deviate from the designed value by variation in the manufacturing condition, the deviations do not affect the oscillation frequency. The oscillation signal of the tank circuit is applied to the phase delaying circuit 61 of the resistor $R_{12}$ and the phase advancing circuit 62 of the capacitor $C_{12}$ through the circuit 5 which is equivalent to a series circuit of the phase delaying and advancing circuits 61 and 62. Therefore, the impedance of the tank circuit does not affect the phase delaying and advancing circuits 61 and 62, to oscillate the whole circuit stably irrespective of the configuration of the tank circuit. Thus, any kind of tank circuit such as the LC resonator and a ceramic filter can be equally applied to the voltage controlled oscillator.

Figure 6:
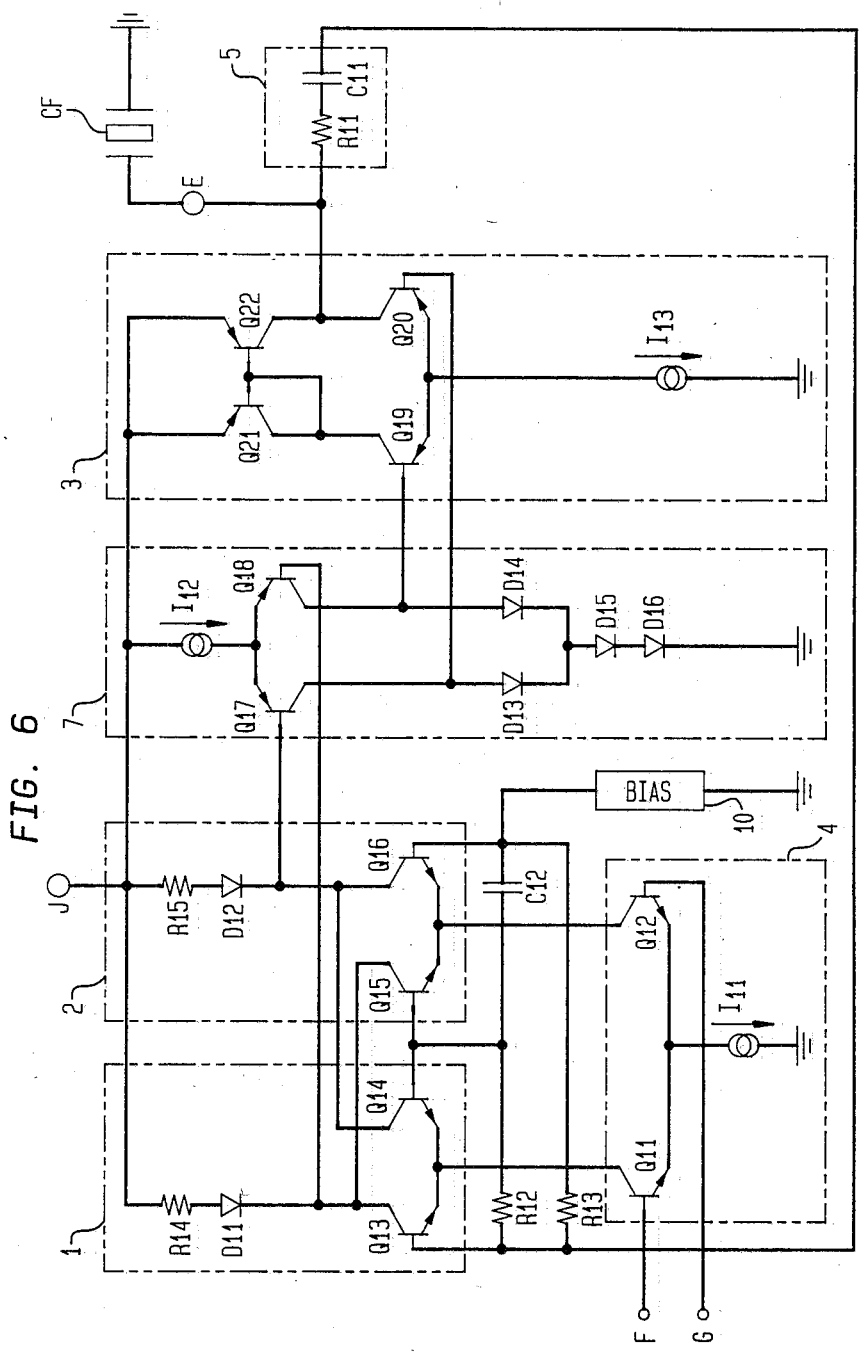
FIG. 6 is a circuit diagram showing a concrete example of the preferred embodiment.

Now, a concrete example of the preferred embodiment shown in FIG. 3 will be explained with reference to FIG. 6. All the circuit elements except for a ceramic filter CF as the tank circuit are formed on a single semiconductor chip having a terminal E, a power terminal J, input terminals F and G and a reference terminal (not shown) held at a grounding potential. The terminal E is externally connected with the ceramic filter CF having a resonant frequency of 608 KHz and internally connected with the circuit 5 which is a resistor $R_{11}$ having a resistance of 15 kilo-ohms and a capacitor $C_{11}$ having a capacitance of 18 pF. The other end of the circuit 5 is connected to a bias circuit 10 through a resistor $R_{12}$ of 15 kilo-ohms as a phase delaying circuit and a capacitor $C_{12}$ of 18 pF as a phase advancing circuit. A resistor $R_{13}$ are connected in parallel with the series connection of the resistor $R_{12}$ and the capacitor $C_{10}$. Both ends of the resistor $R_{12}$ are respectively connected to bases of the transistors $Q_{13}$ and $Q_{14}$ having emitters commonly connected. Similarly, both ends of the capacitor $C_{12}$ are respectively connected to bases of the transistors $Q_{15}$ and $Q_{14}$ having emitters commonly connected. The collectors of the transistors $Q_{13}$ and $Q_{15}$ are connected to a series connection of a resistor $R_{14}$ and a diode $D_{11}$ as a load. The collectors of the transistors $Q_{14}$ and $Q_{16}$ are connected to a series connection of a resistor $R_{15}$ and a diode $D_{12}$ as another load. The common emitters of the transistors $Q_{13}$ and $Q_{14}$ are connected to a collector of a transistor $Q_{11}$ having a base receiving a gain control signal through the input terminal F and the common emitters of the transistor $Q_{15}$ and $Q_{16}$ are connected to a collector of a transistor $Q_{12}$ having a base receiving another gain control signal through the input terminal G. The emitters of the transistors $Q_{11}$ and $Q_{12}$ are grounded through a current source $I_{11}$. The transistors $Q_{11}$ to $Q_{16}$ form the gain controlled amplifiers 1 and 2 and the gain control circuit 4 shown in FIG. 3.

The outputs obtained across the series connection of the resistor $R_{14}$ and the diode $D_{11}$ and across the series connection of the resistor $R_{15}$ and the diode $D_{12}$ are respectively applied to the bases of transistors $Q_{17}$ and $Q_{18}$ having emitters commonly connected to the power terminal L through a current source $I_{12}$. The collector of the transistor $Q_{17}$ is connected to a diode $D_{13}$ as a load, while the collector of the transistor $Q_{18}$ is connected to a diode $D_{14}$ as another load. The diodes $D_{13}$ and $D_{14}$ are in turn grounded through a series connection of diodes $D_{15}$ and $D_{16}$. The transistors $Q_{17}$ and $Q_{18}$ operate as the adder 7 of FIG. 3.

The collectors of the transistors $Q_{17}$ and $Q_{18}$ are then applied to bases of the transistors $Q_{20}$ and $Q_{19}$, respectively. The emitters of the transistors $Q_{19}$ and $Q_{20}$ are commonly grounded through a current source $I_{13}$. The collectors of the transistors $Q_{19}$ and $Q_{20}$ are connected to an active load of a current mirror formed with transistors $Q_{21}$ and $Q_{22}$. The transistors $Q_{19}$ to $Q_{22}$ operates as the amplifier 3 of FIG. 3. The output obtained at the collectors of the transistors $Q_{20}$ and $Q_{22}$ is supplied to the ceramic filter CF through the terminal E and to the circuit 5.

As explained above, the voltage controlled oscillator according to the present invention has an oscillation frequency which depends on the gains of the gain controlled amplifiers and does not depend on variations of resistances of the resistor used in the circuit. In other words, the voltage controlled oscillator according to the present invention has an oscillation frequency which is not affected from the manufacturing condition of the integrated circuit and is most suited for being formed in a form of a semiconductor integrated circuit.

What is claimed is:

1. A voltage controlled oscillator comprising:
 a tank circuit for determining an oscillation frequency;
 a first circuit for delaying the phase of the signal having said oscillation frequency;
 a second circuit for advancing the phase of the circuit being connected in series with said first circuit;
 a third circuit interposed between said tank circuit and said series connection of said first and second circuits, said third circuit having the same equivalent circuit as said series connection of said first and second circuits;
 a first gain controlled amplifier amplifying the phase-delayed signal obtained from said first circuit;
 a second gain controlled amplifier amplifying the phase-advanced signal obtained from said second circuit;
 an adder for adding the outputs from said first and second gain controlled amplifiers;
 a means for controlling the gains of said first and second gain controlled amplifiers; and
 a means for feeding the added signal from said adder to said tank circuit to keep an oscillation of said tank circuit at a frequency determined by the gain of said gain controlled amplifiers.

2. A voltage controlled oscillator as claimed in claim 1, wherein said first circuit and said second circuit are a resistor and a capacitor, respectively.

3. A voltage controlled oscillator as claimed in claim 2, wherein said resistor and said capacitor have a resistance ($\gamma$) and a capacitance (C) satisfying the following equation:

$$f_{res.} = \frac{1}{2\pi\sqrt{\gamma \cdot C}}$$

where $f_{res.}$ is a resonant frequency of said tank circuit.

4. A voltage controlled oscillator as claimed in claim 1, wherein said tank circuit is a parallel connection of an inductor and a capacitor.

5. A voltage controlled oscillator as claimed in claim 1, wherein said tank circuit is a ceramic filter.

6. A voltage controlled oscillator as claimed in claim 1, wherein all the circuit elements except for said tank circuit are formed on a semicondctor chip.

7. A voltage controlled oscillator as claimed in claim 1, wherein said tank circuit is inserted between a one end of said third circuit and a reference voltage point.

8. A voltage controlled oscillator comprising:
 a tank circuit having one end grounded;
 a first series connection of a first resistor and a first capacitor, said first series connection having one end connected with the other end of said tank circuit;
 a second series connection of a second resistor and a second capacitor, said second series connection being connected between the other end of said first series connection and a reference voltage point;
 a first differential amplifier for amplifying the signal obtained across said second resistor, said first differential amplifier including a first transistor, a second transistor and a first current source feeding current to emitters of said first and second transistors;
 a second differential amplifier for amplifying the signal obtained across said second capacitor, said second differential amplifier including a third transistor, a fourth transistor and a second current source feeding current to emitters of said third and fourth transistors;
 a means for controlling said currents from said first and second current sources;
 an adder for adding the outputs from said first and second differential amplifiers, said adder including a fifth transistor having a base receiving the output from said first differential amplifier, a sixth transistor having a base receiving the output from said second differential amplifier and a third current source feeding current to said fifth and sixth transistors;
 an amplifier for amplifying the output from said adder; and
 a feed back means for feeding the output from said amplifier to said tank circuit.

9. A voltage controlled oscillator as claimed in claim 8, wherein said first and second series connections, said first and second differential amplifiers, said adder and said amplifier are formed on a single semiconductor chip.

10. A voltage controlled oscillator as claimed in claim 9, wherein said first and second resistors having the same resistance and said first and second capacitors having the same capacitance.

* * * * *